United States Patent
Cheng et al.

(10) Patent No.: US 6,737,282 B2
(45) Date of Patent: May 18, 2004

(54) METHOD FOR PRODUCING A SINGLE INTEGRATED DEVICE CONTAINING A PLURALITY OF PASSIVE ELEMENTS

(75) Inventors: Syh-Yuh Cheng, Hsinchu (TW); Yun-Tien Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/228,219

(22) Filed: Aug. 27, 2002

(65) Prior Publication Data

US 2003/0100135 A1 May 29, 2003

(30) Foreign Application Priority Data

Sep. 6, 2001 (TW) .................................. 90122082 A (51) Int. Cl.$^7$ .............................................. H01L 21/00
(52) U.S. Cl. .................................... 438/3; 438/210
(58) Field of Search ........................ 438/3, 45, 181, 438/171, 190, 210

(56) References Cited

U.S. PATENT DOCUMENTS 5,836,073 A * 11/1998 Mizuuchi et al. ............. 29/600
2001/0018221 A1 * 8/2001 Takasu et al. ................. 438/3

\* cited by examiner

*Primary Examiner*—Dung A. Le
(74) *Attorney, Agent, or Firm*—Birch, Stewart Kolasch & Birch, LLP (57) ABSTRACT

A method for producing a single integrated device containing a plurality of passive elements. The method includes providing a semiconductive ferroelectric substrate, applying a diffusant onto the substrate, and thermally processing the substrate. The ferroelectric material is a substrate with polycrystalline structure or a thin film formed by $Ba_{1-x}Sr_xTiO_3$ or $Sr_{1-x}Ca_xTiO_3$ or combinations thereof. Thermal processing is performed by isothermal heating or pulse laser.

12 Claims, 12 Drawing Sheets

METHOD FOR PRODUCING A SINGLE INTEGRATED DEVICE CONTAINING A PLURALITY OF PASSIVE ELEMENTS

BACKGROUND OF THE INVENTION

1. Field of the Invention

The present invention relates to a method for producing an integrated device. In particular, the invention involves the preparation of a single integrated device containing a plurality of passive elements.

2. Description of the Prior Art

In the conventional production of integrated devices, a variety of materials are required due to the diverse electrical properties of passive elements. However, it is difficult to control the heterogeneous boundary resulted from employing different materials. Particularly, sintering temperatures of materials vary from one another, which often causes failure during the integration process. Consequently, the production yield is adversely affected. Furthermore, ceramics are often utilized when producing passive elements, and the integration for ceramics is typically carried out using low temperature sintering to produce multi-layer structures. However, during the integration process, the passive elements are formed by thin films of ceramics, where the sintering temperature is usually greater than 850° C., and the temperature of the substrate is greater than 600° C. Therefore, it is very difficult to combine with the integration of multi-layer organic substrates.

Currently, an integration of electronic elements is carried out using thick-film or thin-film structures. However, heterogeneous boundary is even more complicated due to the diverse materials required to obtain different electronic characteristics. Especially when the optimized processing temperatures for various materials are not the same, the risks associated with both the difficulty and reliability for integrating a diversity of materials are relatively high. Furthermore, integration of non-linear elements, such as thermistors and varistors, is restricted in terms of the obtainable specifications and types due to the original characteristics of the materials. Properties of the products are somewhat unfavorably affected as well. As a result, it is an important task to develop an integration technique, which produces embedded passive elements at low temperature.

SUMMARY OF THE INVENTION

In order to overcome the above problems, the invention provides a method for producing a single integrated device containing a plurality of passive elements by modifying the electronic characteristics of the grain boundary. Resistors and capacitors with a wide range of specifications can be produced by adjusting the conditions of grain boundary. Particularly, using different grain boundary barriers and self-induced polarization in grains, non-linear elements, such as thermistors and varistors can be made.

The method for producing a single integrated device containing a plurality of passive elements comprises the steps of: providing a semiconductive ferroelectric substrate; applying diffusant onto the substrate; and thermally processing the substrate.

Another object of the invention is to provide a method for producing non-linear elements and resistors and capacitors on the same substrate using the same or different processing conditions. This allows the integration of passive elements by adjusting electronic characteristics of grain boundary of the substrate.

In addition, another object of the invention is to provide a process for integrating elements, without heating the whole substrate. This operating condition is advantageous to the production and application of burying various elements into a multi-layer printed circuits board. Meanwhile, an effective method for burying high dielectric constant (k) material into printed circuit boards is provided as well.

DETAILED DESCRIPTION OF THE INVENTION

In order to achieve the above objects, the invention provides a method that uses a single semiconductive and polycrystalline material as the substrate and in which the grain boundary of substrate is adjusted by controlling the species and concentrations of the diffusants that enters the grain boundary, thereby obtaining electronic characteristics of different passive elements. The method includes the steps of: providing a semiconductive ferroelectric material as a substrate; applying diffusant onto the substrate; and thermally processing the substrate.

According to the invention, by having a single substrate, there are no complications caused by heterogeneous materials' interfaces. In addition, the thermal process method for driving the diffusant into the substrate is not restricted. The substrate can be heated overall, or a pulse laser can be adopted to direct the heating to a specific spot without heating the whole substrate. When using the laser heating method, only a certain area on the surface of the substrate needs to be heated. Consequently, this method is applicable to produce embedded elements for multi-layer organic substrates. This method is particularly useful for situations where heterogeneous boundary is simple, and a plurality of the integrated elements is involved. In addition, this method is applicable for multi-layer organic substrates.

According to the novel method provided, a lower temperature is required for the substrate, and a simple heterogeneous grain boundary is obtained. Therefore, a wider range of elements including non-linear elements can be produced and a dielectric constant of higher than $10^5$ is achieved. Therefore, higher and more diversified integration are accomplished.

In the present invention, a semiconductive ferroelectric material is used to produce a substrate with polycrystalline structure, or a polycrystalline thin film formed by plating with chemical solution, followed by sintering in reduction atmosphere. A substrate with a sufficiently low resistance is then obtained. Depending on the selection of the substrate composition, the resistance coefficient of the sintered substrate is usually less than 1 $\Omega \cdot cm$. After sintering, photolithography is used to produce a mask on the surface of the sintered semiconductive substrate. After spray or coating with ion solutions (diffusant) that segregate at the grain boundary, thermal process is carried out to drive ions into the grain boundary. Depending on the different concentrations or species of ions of the diffusants applied onto different areas of the substrate, thermal process can be performed by isothermal heating or pulse laser. Isothermal heating is used when different concentrations of ions are used. Pulse laser with different energy is used when the same concentrations of ions are used. These two methods allow the production of grain boundary that exhibits different distributions of different ions. Consequently, different electronic characteristics are obtained.

Figure 1A:
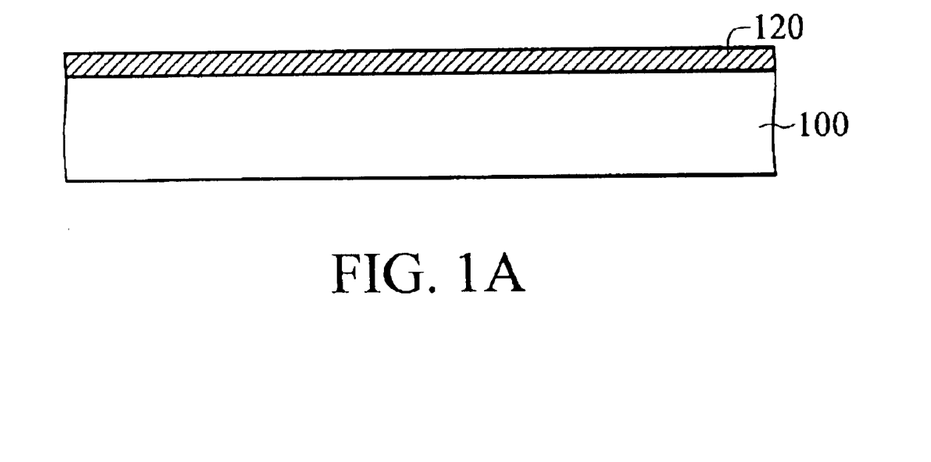
FIGS. 1A~1E are cross sections of the process for producing an integrated device according to the present invention.
Figure 1B:
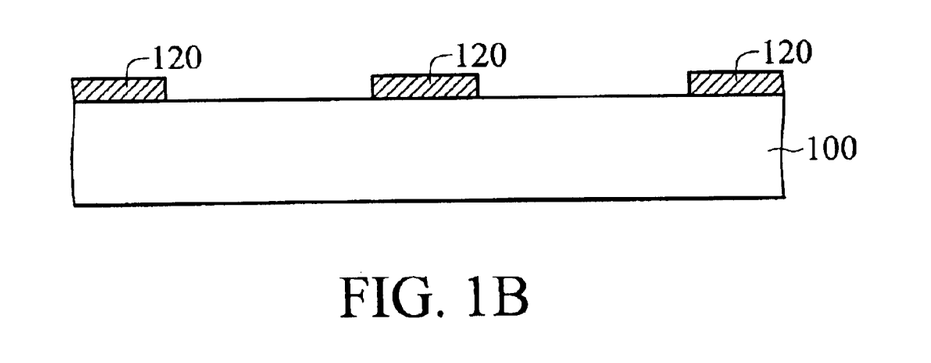
Figure 1C:
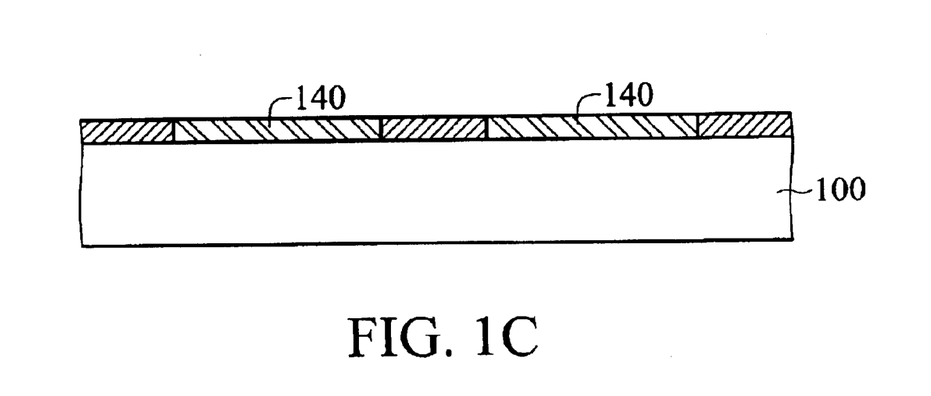
Figure 1D:
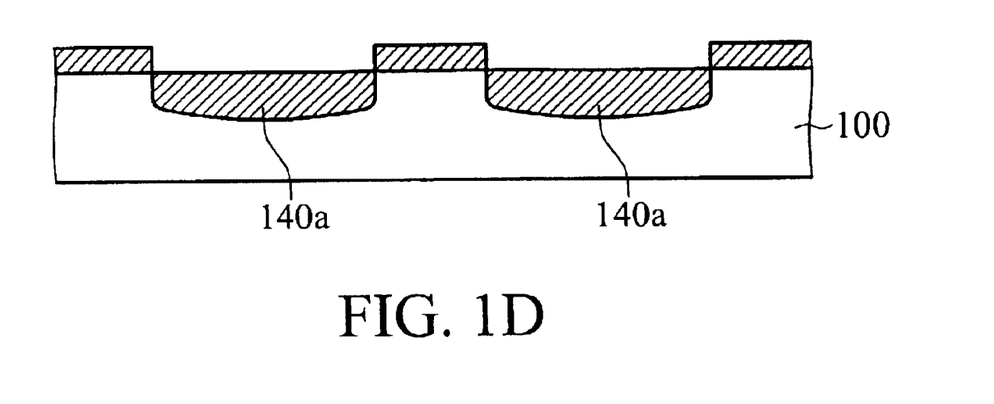
Figure 1E:
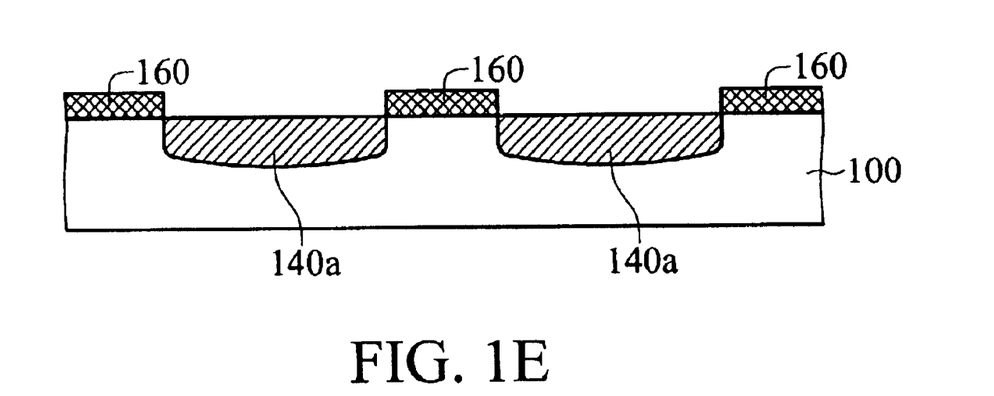

Refer to FIGS. 1A~1E, FIG. 1A illustrates a substrate 100 coated with mask 120. Next, photolithography and etching are carried out to form the pattern shown in FIG. 1B. In FIG. 1C, diffusant 140 are coated onto predetermined positions. Isothermal heating is then performed to drive diffusant 140 into the substrate 100, as shown in FIG. 1D. Finally, the mask is removed to form an outer electrode 160 and an integrated device as shown in FIG. 1E is obtained.

Furthermore, the integration method provided in the present invention is also applicable on a polycrystalline structured thin film formed by plating with chemical solution. The process is shown in FIGS. 2A~2E.

Figure 2A:
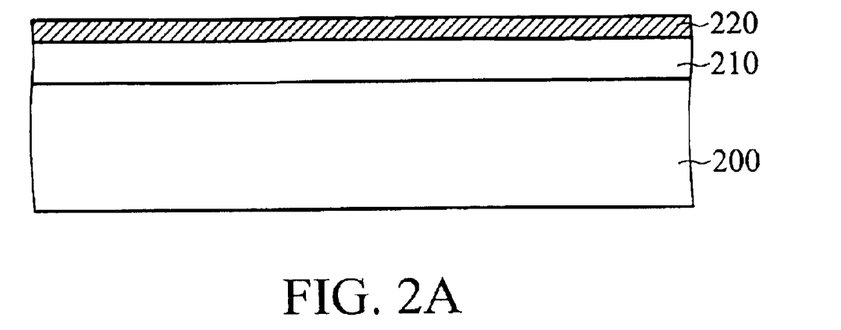
FIGS. 2A~2E are another embodiment of the cross section of the process for producing an integrated device according to the present invention.
Figure 2B:
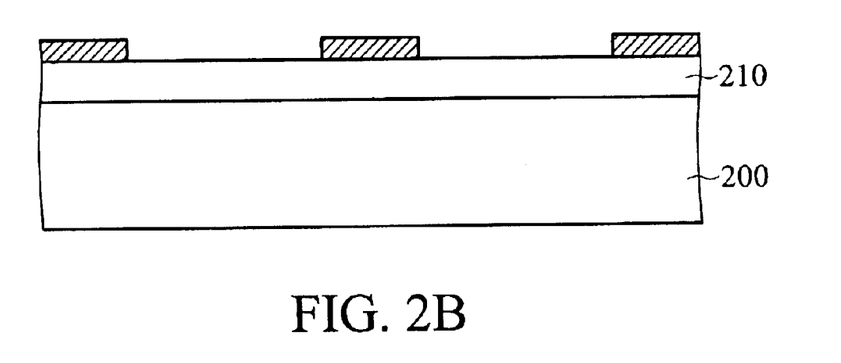
Figure 2C:
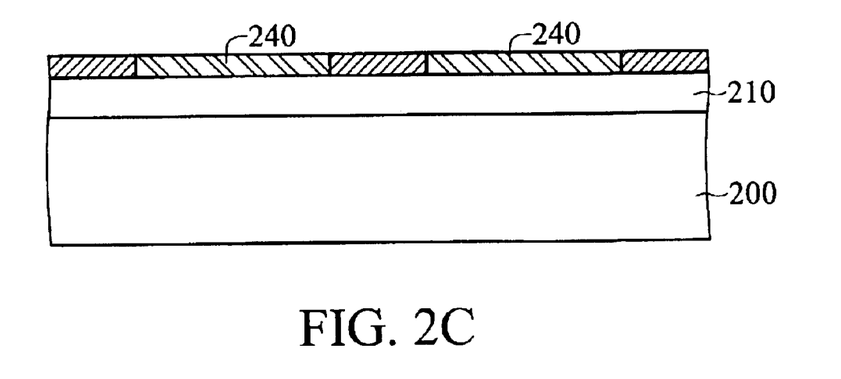
Figure 2D:
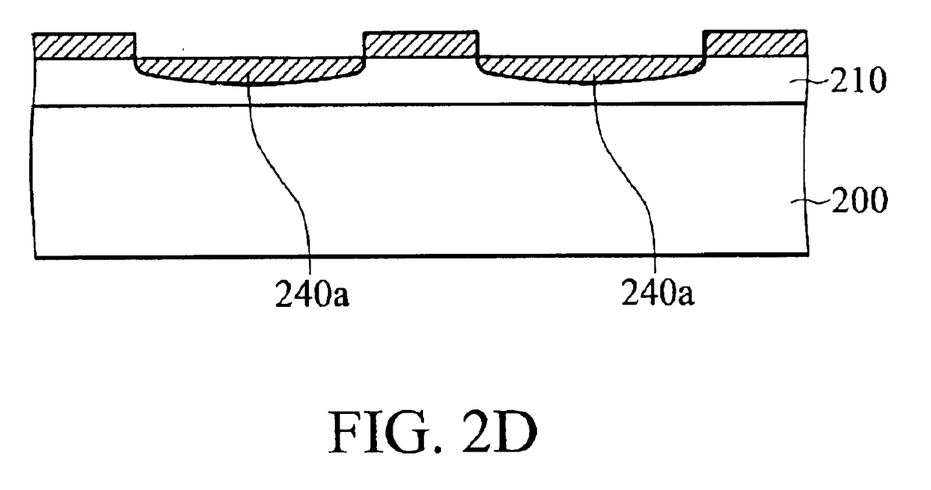
Figure 2E:
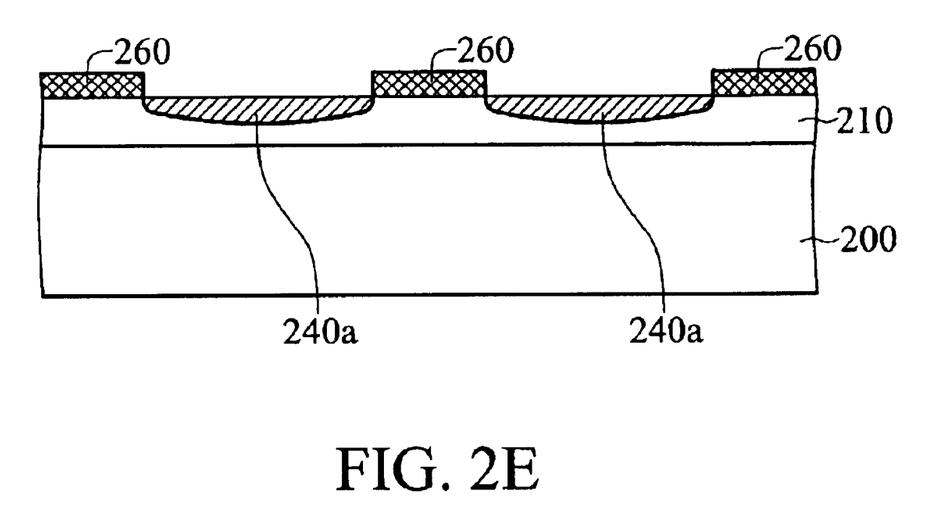

In FIG. 2A, 200 represents a substrate, 210 represents thin film, and 220 represents a mask. Next, as shown in FIGS. 2B and 2C, photolithography and etching are performed, followed by coating with diffusant 240. Pulse laser is then used to drive the diffusant 240a into the substrate, as shown in FIG. 2D. Lastly, the mask is removed to form an outer electrode 260, and an integrated device as shown in FIG. 2E is obtained. During the process, the mask can be removed when driving the diffusant into the substrate (isothermal heating), or after the driving of diffusant (pulse laser).

1st Embodiment

Figure 3A:
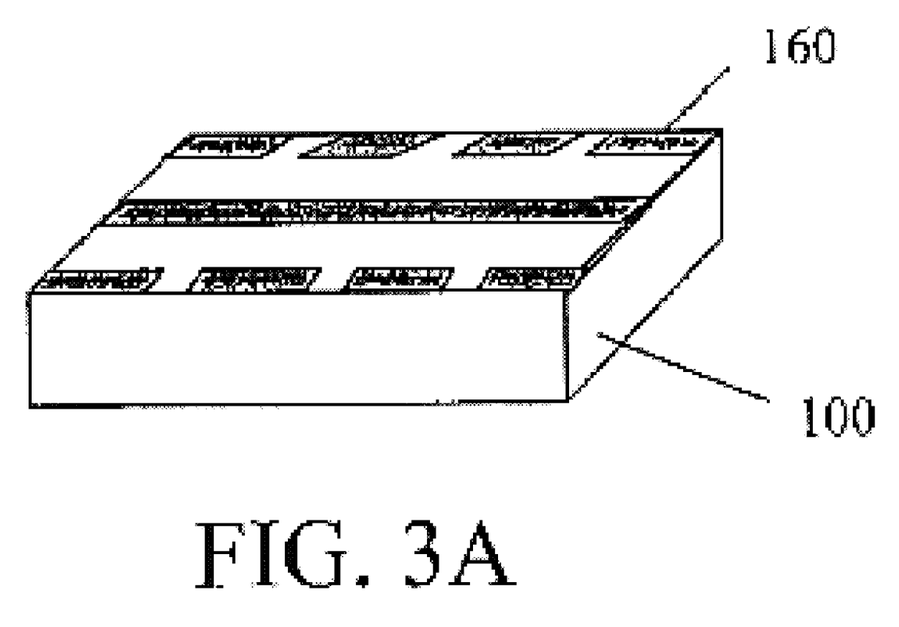
FIG. 3A is a side view of the integrated device according to the 1st embodiment of the invention.
Figure 3B:
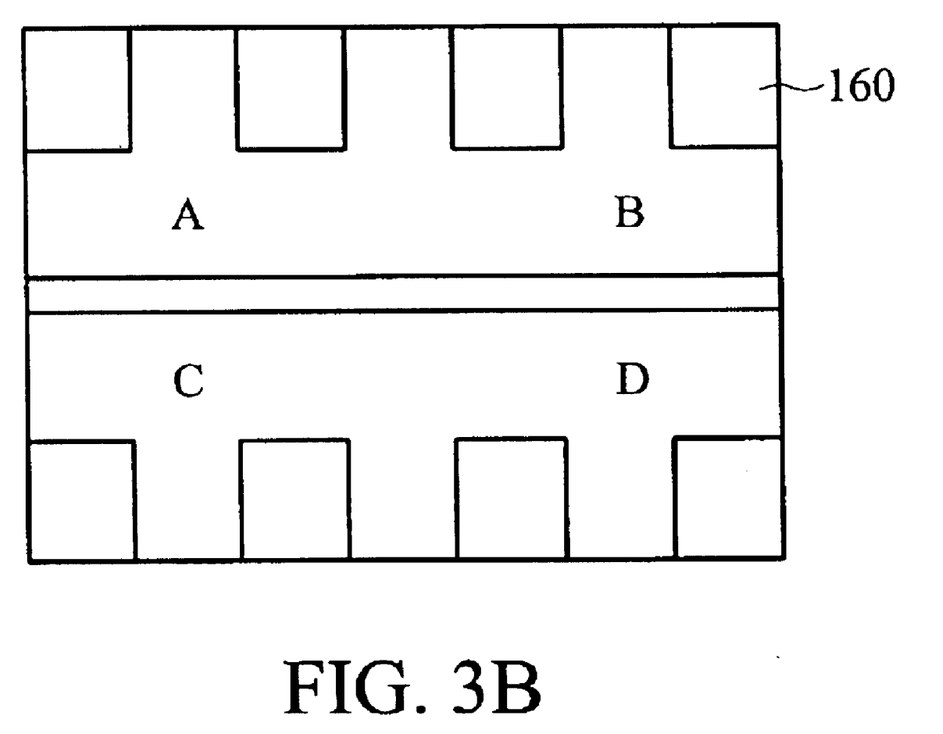
FIG. 3B is a top view of the integrated device according to the 1st embodiment of the invention.
Figure 4:
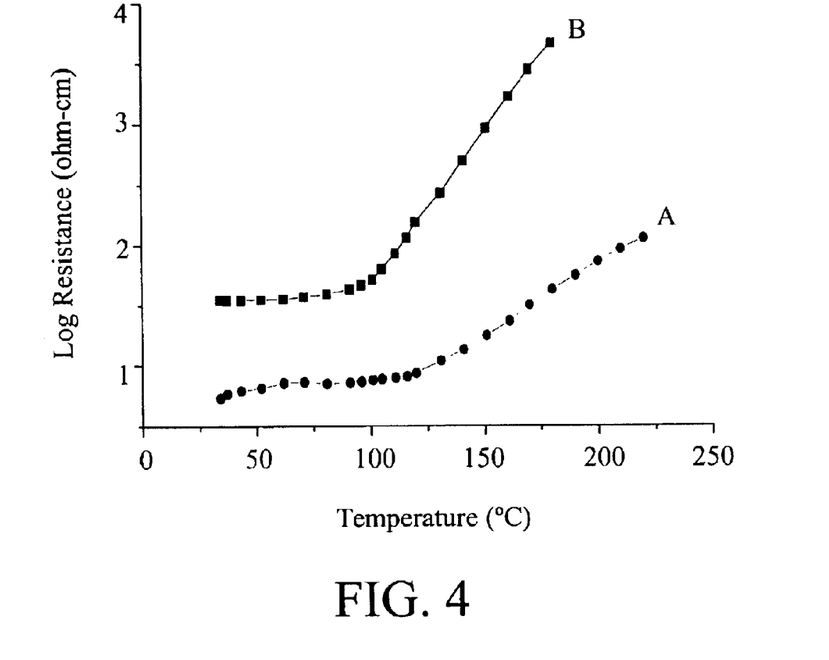
FIGS. 4~6 show the curves of the electronic characteristics of the integrated device according to the 1st embodiment of the invention.
Figure 5:
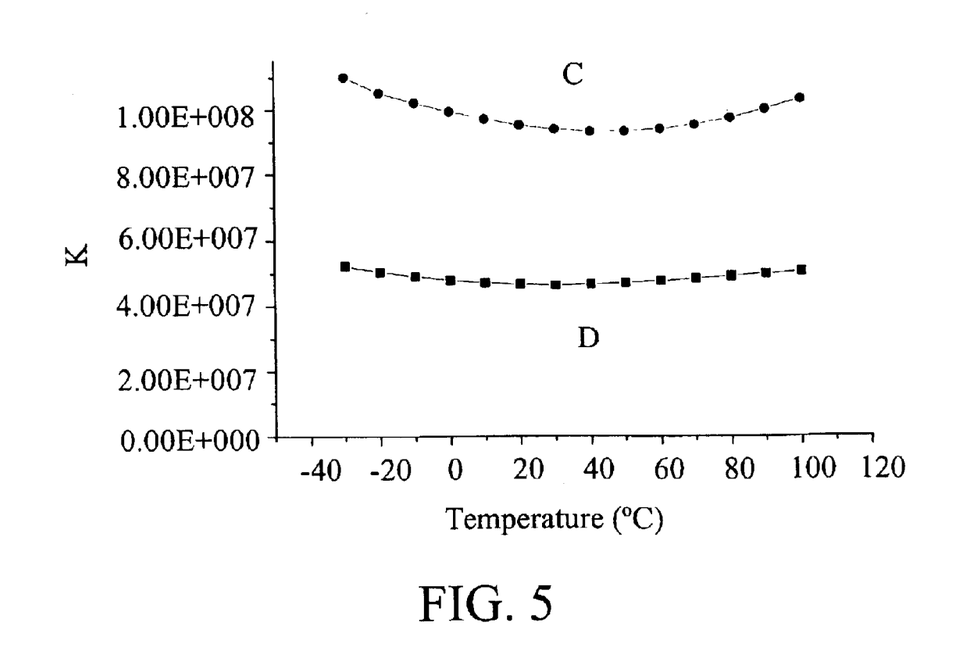
Figure 6:
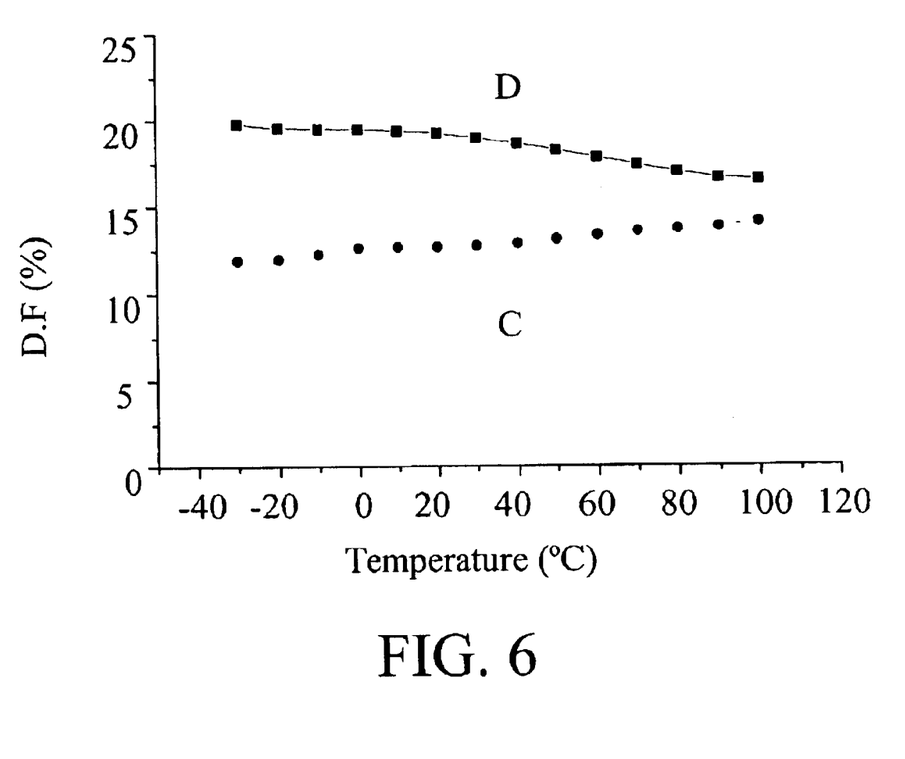
Figure 7:
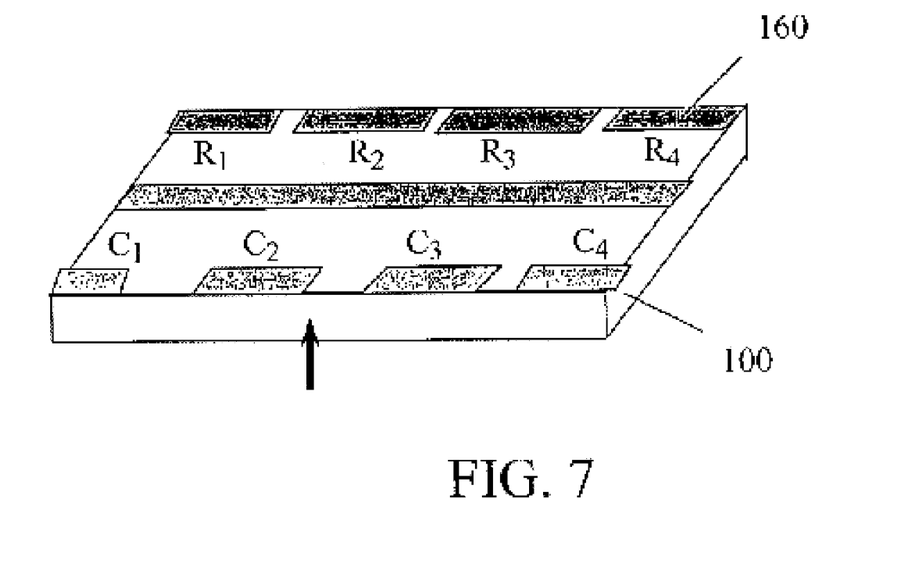
FIG. 7 is a side view of the integrated device according to the 2nd embodiment of the invention.

Semiconductive $Ba_{0.9}Sr_{0.1}Ti_{1.01}O_3$ ($\rho=8$ $\Omega \cdot cm$) was used as the substrate 100, as shown in FIG. 3A, wherein the substrate includes an electrode 160, divided into four areas. FIG. 3B is a top view of the substrate, wherein no diffusant was applied onto the top left area (A); a low concentration of diffusant was applied to the top right area (B); a medium concentration of diffusant was applied onto the bottom right area (D); and a high concentration of diffusant was applied onto the bottom left area (C). The diffusant used in this embodiment was 0.03M Li—Mn solution, and the diffusion condition was thermal process at 1000° C. for 30 minutes. As shown in FIG. 4, the top left area (A) without the addition of diffusant exhibits the characteristics of a resistor at room temperature, and only a slight raise in resistance was observed around 125° C. When the concentration of Li—Mn diffusion was set at 0.1 mol % (top right area B), a similar characteristics of a resistor is shown, and an obvious resistor with a positive temperature coefficient was observed at 100° C. Therefore, the top right area, thermal processed at 1000° C./30 min, exhibits thermistor characteristic by having a positive temperature coefficient (PTC), shown as B in FIG. 4. When the diffusive concentration was increased to 0.5 mol % (bottom right area) and 1.0 mol % (bottom left area) respectively, after the same thermal process, the areas exhibited obvious characteristics of capacitors. Dielectric loss decreases when the concentration increases, as shown in FIGS. 5 and 6 respectively, where C represents the bottom left area with high concentration and D represents the bottom right area with medium concentration.

It is observed that by utilizing different concentrations of diffusant with the same ions on the same substrate, characteristics of resistor, thermistor and capacitor are obtained using the same thermal process condition. Effective dielectric coefficient of the capacitor is greater than $10^7$.

2nd Embodiment

Semiconductive $SrTi_{1.01}O_3$ was used as a substrate 100. The substrate exhibited a resistance of 0.3 $\Omega \cdot cm$. The substrate included an electrode 160, divided into eight areas, the top half (R1–R4) were resistors without the addition of diffusant; and bottom half (C1–C4) were capacitors, where C1 and C2 used Li—Mn diffusant, and C3 and C4 used Li—Mn—Cu diffusant. Diffusant used in the embodiment was 0.03M Li—Mn solution. The diffusion condition was thermal process at 1000° C. for 30 mins. Before thermal processing, the resistor coefficient was 0.3 $\Omega \cdot cm$. Identical concentrations of diffusants, Li—Mn and Li—Mn—Cu ions solutions were applied onto different areas. After thermal processinging at 1000° C. for 30 minutes, resistance and capacitance were tested and are listed in Table 1 and 2. The areas without the addition of diffusant exhibit the characteristics of a linear resistor, and have a resistivity of 2.2~2.9 $k\Omega \cdot cm$. The areas with the addition of diffusant exhibit the characteristics of capacitors, with a dielectric coefficient of $4 \times 10^6$, and the dielectric loss was about 3%. The area with the addition of Li—Mn—Cu diffusant exhibits the lowest dielectric loss (about 2.5%).

TABLE 1

| Diffusion condition | R1 | R2 | R3 | R4 | C1 (nF) [tanδ (%)] | C2 (nF) [tanδ (%)] | C3 (nF) [tanδ (%)] | C4 (nF) [tanδ (%)] |
| --- | --- | --- | --- | --- | --- | --- | --- | --- |
| 950° C./30 min | 2.1 | 1.6 | 1.9 | 2.0 | 5.4 [5.5] | 5.1 [6.1] | 5.6 [4.8] | 5.3 [5.3] |
| 1000° C./30 min | — | — | — | — | 0.55 [3.1] | 0.53 [3.5] | 0.54 [2.4] | 0.52 [2.6] |

TABLE 2

| Diffusion condition | ρ1 (kΩm) | ρ2 (kΩm) | ρ3 (kΩm) | ρ4 (kΩm) | K1 (×10⁷) | K2 (×10⁷) | K3 (×10⁷) | K4 (×10⁷) |
|---|---|---|---|---|---|---|---|---|
| 950° C./30 min | 2.9 | 2.2 | 2.6 | 2.8 | 4.4 | 4.1 | 4.5 | 4.3 |
| 1000° C./30 min | — | — | — | — | 0.45 | 0.43 | 0.44 | 0.42 |

3$^{rd}$ Embodiment

Figure 8:
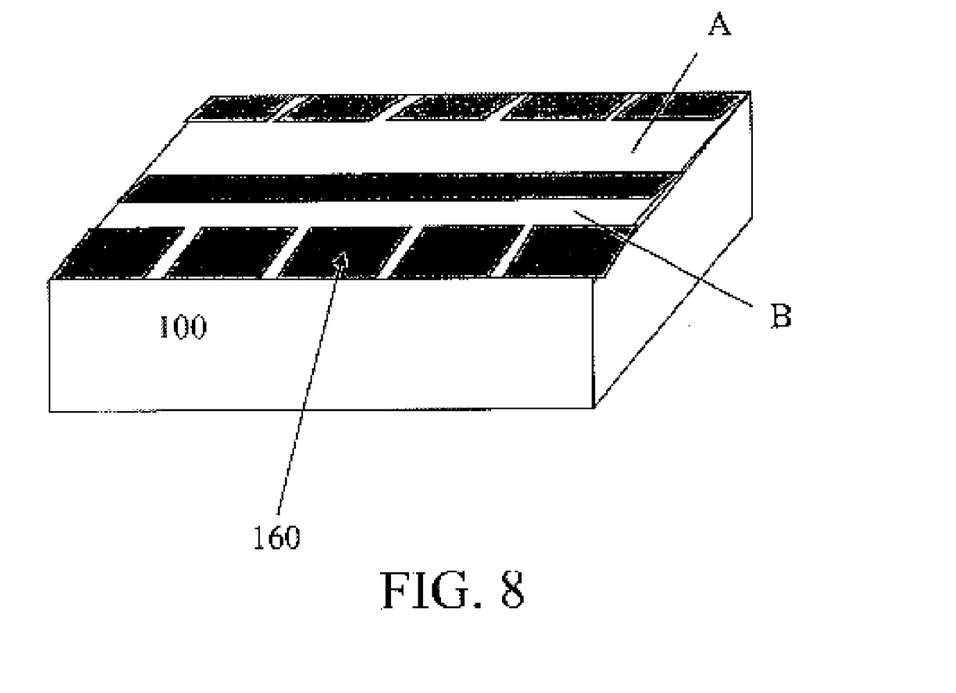
FIG. 8 is a side view of the integrated device according to the 3rd embodiment of the invention.
Figure 9:
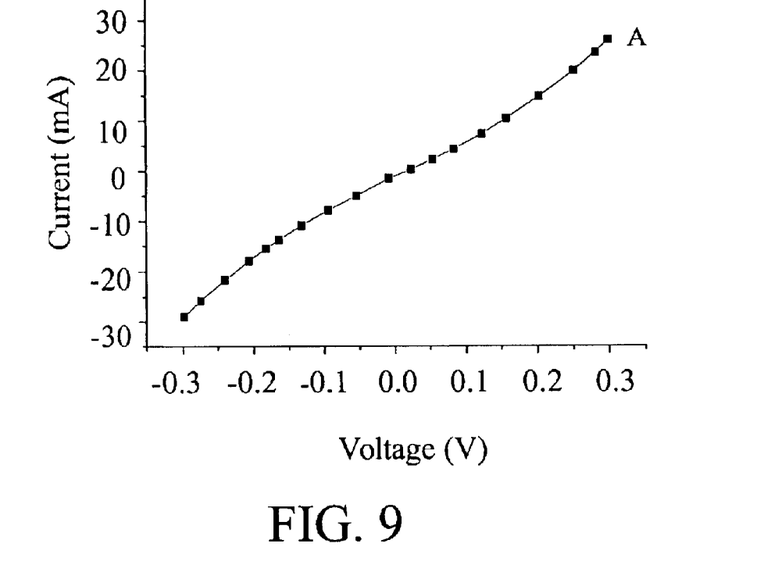
FIGS. 9~10 show the curves of the electronic characteristics of the integrated device according to the 3rd embodiment of the invention.
Figure 10:
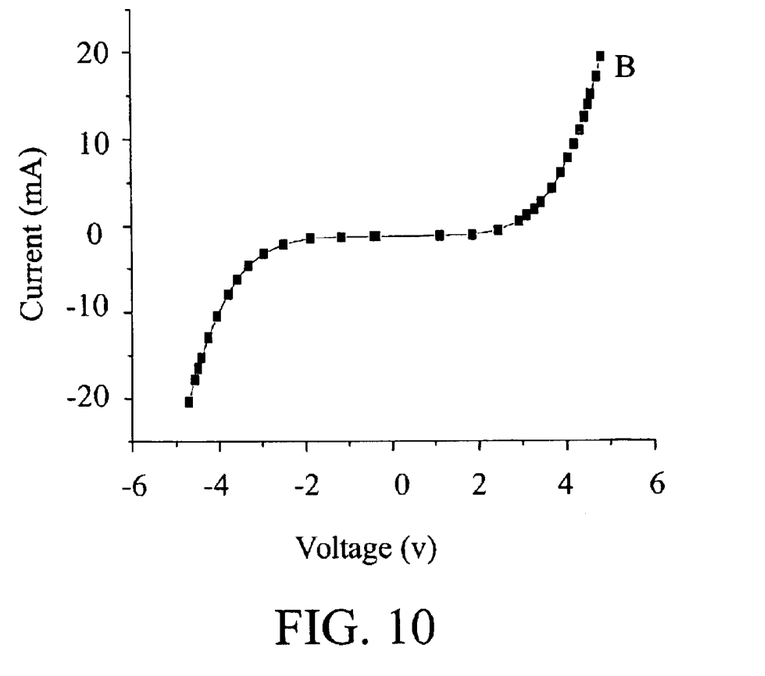

In order to fabricate a resistor with even lower resistance coefficient, a semiconductive $Sr_{0.75}Ca_{0.25}Ti_{1.04}O_3$ was used as a substrate 100, with a resistor coefficient of 0.15 Ω·cm, as shown in FIG. 8. The substrate included an electrode 160, divided into a top part A and a bottom part B. No diffusant was applied on the top part A, and the bottom part B was applied with 0.01M of Li—Mn diffusant. After thermal processing at 1000° C. for 30 minutes, the resistance coefficient of the top part A was about 2 Ω·cm with a good characteristics of a linear resistor, as shown in FIG. 9. As shown in FIG. 10, the bottom part B with a low concentration of diffusant exhibits the characteristics of a varistor, with a varistor voltage of 2.4V/mm and a non-linear index of 7.5.

This embodiment illustrates the fact that a linear resistor and a non-linear resistor may be formed on the same substrate.

4$^{th}$ Embodiment

In order to test the reduction of effective resistance, two substrate ($Sr_{0.75}Ca_{0.25}Ti_{1.01}O_3$ and $Sr_{0.9}Ca_{0.1}Ti_{1.01}O_3$) were used. After 1 mol % Bi and 3 mol % Ti were respective applied onto the substrate, without the addition of diffusant, they were subjected to thermal process at 1000° C. for 30 mins. The resistance coefficients raised from <10 Ω·cm to >2 Ω·cm (adding 3 mol % of Ti) and >10 Ω·cm (adding 1 mol % of Bi) respectively. Ta ion solution was applied onto the same substrate. After thermal processing at 1000° C. for 30 minutes, resistance were tested and are listed in Table 3.

TABLE 3

| Composition | ρ (Ω.cm) (no diffusant) | (Ta diffusant) |
|---|---|---|
| A + 3 mol % Ti | 1.9 | 0.4 |
| A + 1 mol % Bi | 31.6 | 6.6 |
| B + 3 mol % Ti | 3.2 | 1.8 |
| B + 1 mol % Bi | 14.0 | 1.8 |

NOTE:
A represents $Sr_{0.75}Ca_{0.25}Ti_{1.01}O_3$,
B represents $Sr_{0.9}Ca_{0.1}Ti_{1.01}O_3$.

An effective method to lower the effective resistance is illustrated in Table 3, where Ta ion solution is applied onto the same substrate, followed by thermal process of 1000° C./30 min, the resistance coefficient decreases. Therefore, diffusion of Ta ions helps the stabilization of the resistance coefficient of the substrate after thermal processing.

5$^{th}$ Embodiment

Semiconductive $SrTi_{1.01}O_3$ was used as a substrate. Different concentrations of diffusants were used and the thermal process were 1060° C./30 minutes. Capacitance and dielectric loss were tested and are listed as Table 4.

TABLE 4

| Diffusant | Diffusion condition | K (×10⁶) | tanδ (%) |
|---|---|---|---|
| No diffusant | 1060° C./30 min | 0.5 | 20.5 |
| 0.03 M Cu | 1060° C./30 min | 7.8 | 2.9 |
| 0.06 M Cu | 1060° C./30 min | 2.9 | 2.6 |
| 0.03 M Li, Mn | 1060° C./30 min | 4.5 | 3.1 |
| 0.03 M Li, Mn, Cu | 1060° C./30 min | 4.5 | 2.4 |
| 0.06 M Li, Mn, Cu | 1060° C./30 min | 3.0 | 3.1 |

Table 4 illustrates the effect of increasing the thermal process temperature, where higher concentration of diffusant or high thermal process temperature are effective in improving the characteristics of capacitor, and the dielectric loss is reduced to less than 3%. It is also observed from Table 4 that the more species of diffusion ions used, the more improvement is observed in the characteristics of capacitor. After thermal processing at 1060° C. for 30 minutes, the area without the addition of diffusant shows the characteristics of a capacitor and the curve of current vs voltages exhibits the characteristics of a varistor. Therefore, for a substrate subjected to higher thermal process temperature, the characteristics of the substrate switch from resistor to varistor and capacitor.

Figure 11:
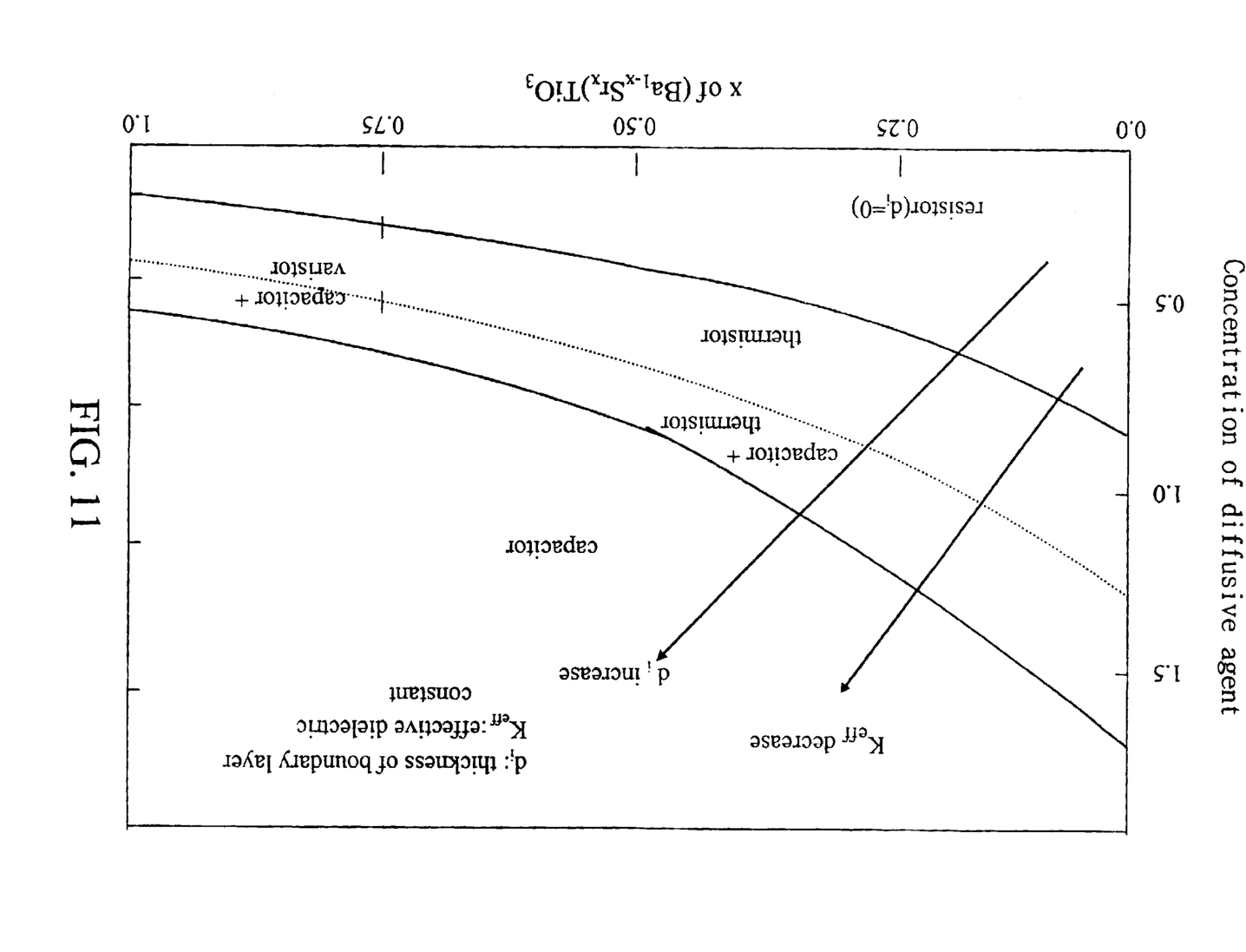
FIGS. 11~12 illustrate the effect of the concentration of the diffusant on the electronic characteristics of the integrated device according to the 6th embodiment of the invention.
Figure 12:
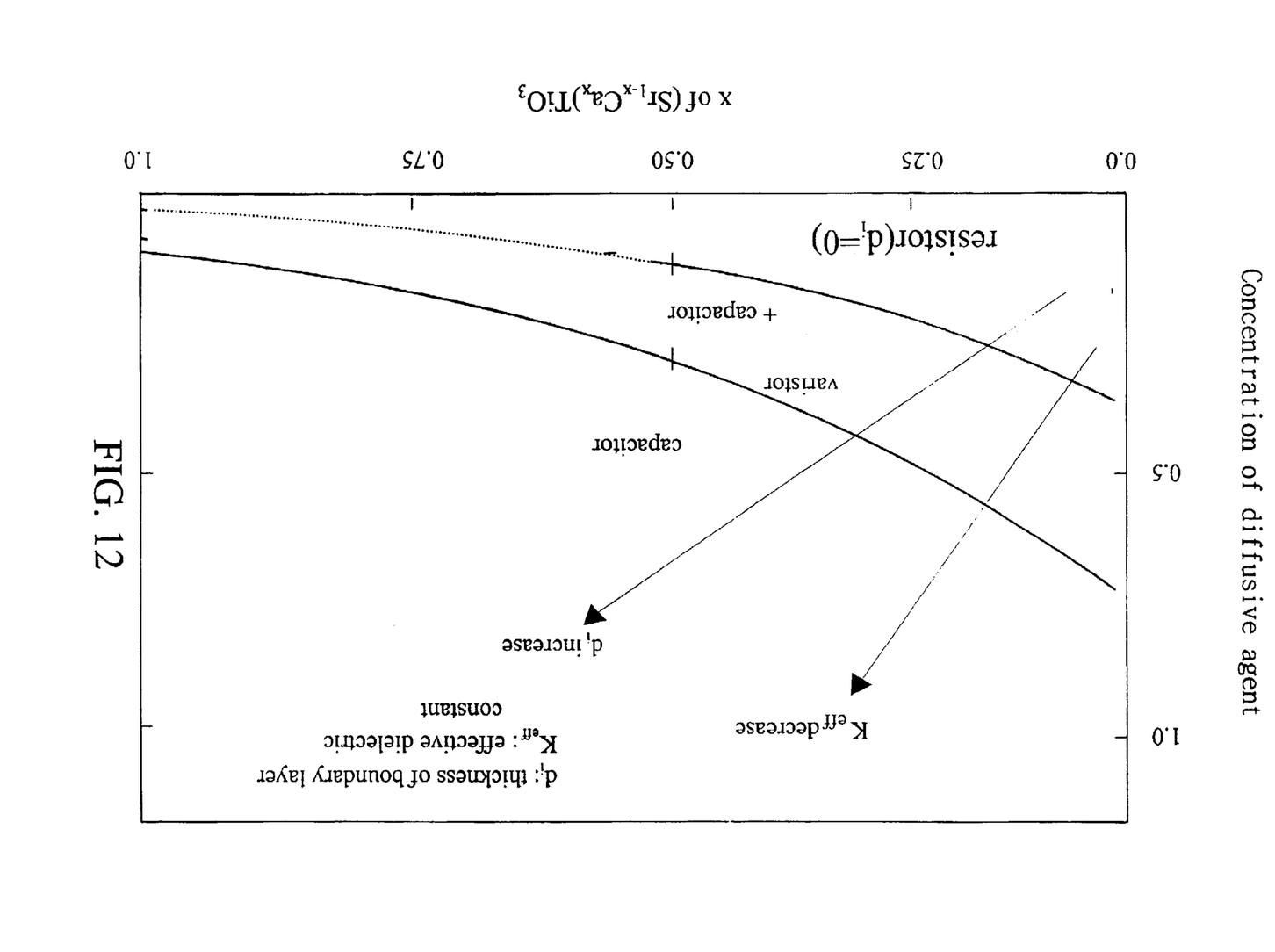

6$^{th}$ Embodiment $Ba_{1-x}Sr_xTiO_3$ and $Sr_{1-x}Ca_xTiO_3$ were used as the semiconductive substrate. Thermal processing was carried out at 1000° C. for 30 minutes. Diffusant was Li—Mn ions. The relationship of the concentration of the diffusant and the areas that exhibit different electrical characteristics were tested. The results are illustrated as FIGS. 11 and 12. In FIGS. 11 and 12, X-axis represents the x value for $Ba_{1-x}Sr_xTiO_3$ and $Sr_{1-x}Ca_xTiO_3$. Y-axis represents the concentration of the diffusant. When x increases, i.e. the amount of Sr or Ca increases, the areas that exhibit resistor characteristics decrease. di represents the thickness of the boundary layer. $K_{eff}$ represents the effective dielectric constant. When x is greater than 0.35 for $Ba_{1-x}Sr_xTiO_3$, since the Curie temperature is less than the room temperature, the area exhibits the positive temperature coefficient subsequently replaced by negative temperature coefficient. The area exhibits a varistor characteristic relatively reduced. When the amount of Sr increases, the resistivity of the thermistor increases as well. It is observed that the substrate exhibits varistor characteristics when measuring the current vs voltage. This is in accordance with the results when the amount of Ca is low for $Sr_{1-x}Ca_xTiO_3$. As shown in FIG. 12, when the amount of Ca increases, the area exhibiting linear resistance is less than the one for $Ba_{1-x}Sr_xTiO_3$ due to the increase of the diffusant.

The results show that when x is greater than 0.5, the stability of the substrate is adversely affected by the amount of the diffusant and the thermal process condition. A vague boundary between the resistance characteristic and the varistor characteristic is also observed. In this case, the area with capacitor characteristics is more easily produced. However, the electronic characteristics of this area are not easily controlled in application.

From the above results, a single substrate with the characteristics of linear resistance, non-linear resistance and capacitance can be produced using different concentrations and species of diffusants with the suitable thermal process conditions. The resistance characteristics of the linear resistor are improved by diffusing with high valence ions, such as Ta. The improvement for the capacitance characteristics (reducing the dielectric loss) is achieved by increasing the concentration of the diffusant, diffusion temperature or the species of diffusive ions. The last is the most effective and applicable of the three.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for producing a single integrated device containing a plurality of passive elements, comprising:

providing a semiconductive ferroelectric substrate;

applying diffusant onto the substrate, wherein the diffusant comprises at least one Group IA element selected from the group consisting of Li, Na, and K and at least one transition metal selected from the group consisting of Cr, Mn, Fe, Co, Ni, Cu and Zn; and isothermally heating the substrate to form areas with different ionic concentrations for the passive elements.

2. The method as claimed in claim 1, wherein the ferroelectric substrate is a thin film of ferroelectric material formed on a substrate.

3. The method as claimed in claim 1, wherein the passive elements are linear resistor, capacitor, thermistor, varistors or combinations thereof.

4. The method as claimed in claim 1, wherein the ferroelectric material is a polycrystalline structure substrate or a thin film formed by $Ba_{1-x}Sr_xTiO_3$ or $Sr_{1-x}Ca_xTiO_3$ or combinations thereof.

5. The method as claimed in claim 1, wherein the improvement on the characteristics of linear resistor is obtained by diffusion of high valence ions Ta or Nb.

6. The method as claimed in claim 1, wherein the concentration of the diffusant is controlled by spraying or coating.

7. A method for producing a single integrated device containing a plurality of passive elements, comprising:

providing a semiconductive ferroelectric substrate;

applying diffusant onto the substrate, wherein the diffusant comprises at least one Group IA element selected from the group consisting of Li, Na, and K and at least one transition metal selected from the group consisting of Cr, Mn, Fe, Co, Ni, Cu and Zn; and thermally processing the substrate by pulse layer to form areas with different ionic concentrations for the passive elements.

8. The method as claimed in claim 7, wherein the ferroelectric substrate is a thin film of ferroelectric material formed on a substrate.

9. The method as claimed in claim 7, wherein the passive elements are linear resistor, capacitor, thermistor, varistors or combinations thereof.

10. The method as claimed in claim 7, wherein the ferroelectric material is a polycrystalline structure substrate or a thin film formed by $Ba_{1-x}Sr_xTiO_3$ or $Sr_{1-x}Ca_xTiO_3$ or combinations thereof.

11. The method as claimed in claim 7, wherein the improvement on the characteristics of linear resistor is obtained by diffusion of high valence ions Ta or Nb.

12. The method as claimed in claim 7, wherein the concentration of the diffusant is controlled by spraying or coating.

* * * * *